United States Patent
Namekawa

[11] Patent Number: 6,115,301
[45] Date of Patent: *Sep. 5, 2000

[54] SEMICONDUCTOR MEMORY DEVICE HAVING DEFECT RELIEVING SYSTEM USING DATA LINE SHIFT METHOD

[75] Inventor: Toshimasa Namekawa, Tokyo, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/259,274

[22] Filed: Mar. 1, 1999

[30] Foreign Application Priority Data

Mar. 3, 1998 [JP] Japan ................... 10-050775

[51] Int. Cl.$^7$ ..................................................... G11C 7/00
[52] U.S. Cl. ............... 365/200; 365/225.7; 365/230.03; 365/230.06
[58] Field of Search ............... 365/200, 225.7, 365/230.03, 230.06

[56] References Cited

U.S. PATENT DOCUMENTS

| | | |
|---|---|---|
| 4,691,300 | 9/1987 | Pelley, III et al. ................. 365/200 |
| 5,134,584 | 7/1992 | Boler et al. ........................ 365/200 |
| 5,274,593 | 12/1993 | Proebsting ........................ 365/250 |
| 5,379,259 | 1/1995 | Fujita .............................. 365/200 |
| 5,457,656 | 10/1995 | Fu .................................. 365/200 |
| 5,787,046 | 7/1998 | Furuyama et al. ............... 365/230.03 |
| 5,953,264 | 9/1999 | Hirano et al. ..................... 365/200 |
| 5,959,908 | 9/1999 | Shiratake ........................ 365/200 |

FOREIGN PATENT DOCUMENTS

| | | |
|---|---|---|
| 0434200A1 | 10/1990 | European Pat. Off. . |
| 5-307896 | 11/1993 | Japan . |
| 7-114800 | 5/1995 | Japan . |

*Primary Examiner*—Richard Elms
*Assistant Examiner*—Tuan T. Nguyen
*Attorney, Agent, or Firm*—Banner & Witcoff, Ltd.

[57] ABSTRACT

A defective address memory circuit stores the address of a defective data line, and outputs a signal for replacing the defective data line depending on the stored address. Decode circuits constituting a decoder group simultaneously output signals for replacing data lines depending on the output signal from the defective address memory circuit. First and second switch groups shift data lines in the direction of a redundant data line depending on an output signal from the decode circuit to instantaneously replace the defective data line.

18 Claims, 10 Drawing Sheets

| DECODER | LOGIC OF DECODER | 0 | 1 | 2 | 3 | 4 | 5 | 6 | 7 | 8 | 9 | A | B | C | D | E | F |
|---|---|---|---|---|---|---|---|---|---|---|---|---|---|---|---|---|---|
| D0 | FE | 1 | 1 | 1 | 1 | 1 | 1 | 1 | 1 | 1 | 1 | 1 | 1 | 1 | 1 | 1 | 1 |
| D1 | F0 + F1 + F2 + F3 | 0 | 1 | 1 | 1 | 1 | 1 | 1 | 1 | 1 | 1 | 1 | 1 | 1 | 1 | 1 | 1 |
| D2 | F1 + F2 + F3 | 0 | 0 | 1 | 1 | 1 | 1 | 1 | 1 | 1 | 1 | 1 | 1 | 1 | 1 | 1 | 1 |
| D3 | (F0 · F1) + F2 + F3 | 0 | 0 | 0 | 1 | 1 | 1 | 1 | 1 | 1 | 1 | 1 | 1 | 1 | 1 | 1 | 1 |
| D4 | F2 + F3 | 0 | 0 | 0 | 0 | 1 | 1 | 1 | 1 | 1 | 1 | 1 | 1 | 1 | 1 | 1 | 1 |
| D5 | ((F0 + F1) · F2) + F3 | 0 | 0 | 0 | 0 | 0 | 1 | 1 | 1 | 1 | 1 | 1 | 1 | 1 | 1 | 1 | 1 |
| D6 | (F1 · F2) + F3 | 0 | 0 | 0 | 0 | 0 | 0 | 1 | 1 | 1 | 1 | 1 | 1 | 1 | 1 | 1 | 1 |
| D7 | (F0 · F1 · F2) + F3 | 0 | 0 | 0 | 0 | 0 | 0 | 0 | 1 | 1 | 1 | 1 | 1 | 1 | 1 | 1 | 1 |
| D8 | F3 | 0 | 0 | 0 | 0 | 0 | 0 | 0 | 0 | 1 | 1 | 1 | 1 | 1 | 1 | 1 | 1 |
| D9 | (F0 + F1 + F2) · F3 | 0 | 0 | 0 | 0 | 0 | 0 | 0 | 0 | 0 | 1 | 1 | 1 | 1 | 1 | 1 | 1 |
| D10 | (F1 + F2) · F3 | 0 | 0 | 0 | 0 | 0 | 0 | 0 | 0 | 0 | 0 | 1 | 1 | 1 | 1 | 1 | 1 |
| D11 | ((F0 · F1) + F2) · F3 | 0 | 0 | 0 | 0 | 0 | 0 | 0 | 0 | 0 | 0 | 0 | 1 | 1 | 1 | 1 | 1 |
| D12 | F2 · F3 | 0 | 0 | 0 | 0 | 0 | 0 | 0 | 0 | 0 | 0 | 0 | 0 | 1 | 1 | 1 | 1 |
| D13 | (F0 + F1) · F2 · F3 | 0 | 0 | 0 | 0 | 0 | 0 | 0 | 0 | 0 | 0 | 0 | 0 | 0 | 1 | 1 | 1 |
| D14 | F1 · F2 · F3 | 0 | 0 | 0 | 0 | 0 | 0 | 0 | 0 | 0 | 0 | 0 | 0 | 0 | 0 | 1 | 1 |
| D15 | F0 · F1 · F2 · F3 | 0 | 0 | 0 | 0 | 0 | 0 | 0 | 0 | 0 | 0 | 0 | 0 | 0 | 0 | 0 | 1 |

TRUTH VALUE FOR INPUT (F0 TO F3)

| LOGIC OF PRE-DECODER |
|---|
| za0 = F[2]  \|\|  F[1]  \|\|  F[0] |
| za1 = F[2]  \|\|  F[1] |
| za2 = F[2]  \|\|  (F[1] && F[0]) |
| za3 = F[2] |
| za4 = F[2]  &&  (F[1] \|\| F[0]) |
| za5 = F[2]  &&  F[1] |
| za6 = F[2]  &&  F[1] && F[0] |
| zb0 = F[5]  \|\|  F[4]  \|\|  F[3] |
| zb1 = F[5]  \|\|  F[4] |
| zb2 = F[5]  \|\|  (F[4] && F[3]) |
| zb3 = F[5] |
| zb4 = F[5]  &&  (F[4] \|\| F[3]) |
| zb5 = F[5]  &&  F[4] |
| zb6 = F[5]  &&  F[4] && F[3] |
| zc1 = F[7]  \|\|  F[6] |
| zc2 = F[7] |
| zc3 = F[7]  &&  F[6] |

SEMICONDUCTOR MEMORY DEVICE HAVING DEFECT RELIEVING SYSTEM USING DATA LINE SHIFT METHOD

BACKGROUND OF THE INVENTION

The present invention relates to a semiconductor memory device having a defect relieving system which is applied to, e.g., a dynamic random access memory (to be referred to as a DRAM hereinafter), in particular, in which a data line is replaced depending on an input address.

A large-capacity semiconductor memory device has redundant memory cells and employs a relieving method for replacing a defective memory cell with a redundant memory cell. When such a defective memory cell is relieved, a yield of semiconductor memory devices can be improved.

The total capacity of a semiconductor memory device is a product of a row address R, a column address C, and a data line width (the number of bits) W. In recent years, since a large bus width is strongly demanded, the data line width W increases, and the row address R or the column address C tends to relatively decrease. For example, in case of 64-Mbit DRAM, R=4K, C=1K, and W=16 are conventionally satisfied. However, a DRAM merged to a logic circuit applied to a system-on chip which recently appears satisfies R=4K, C=64, and W=256.

In a conventional DRAM, word lines are replaced with each other depending on a row address, or bit lines are replaced with each other depending on a column address to relief a defective memory cell. However, in this method, when the address width of rows or columns is small, a high relieving rate cannot be obtained without preparing a relatively large number of redundant memory cells.

In a semiconductor memory device having a large data line width, it is known that a high relieving rate can be obtained in a method in which a redundant memory cell and a redundant data line connected thereto are prepared, and a defective data line is replaced with the redundant data line. As a data line replacing method of this type, a data line shift method is generally used. In the data line shift method, a defective data line is replaced with an adjacent data line, and the replaced data line is replaced with another adjacent data line, the replacing process is repeated, and the last data line is replaced with a redundant data line.

Figure 11:
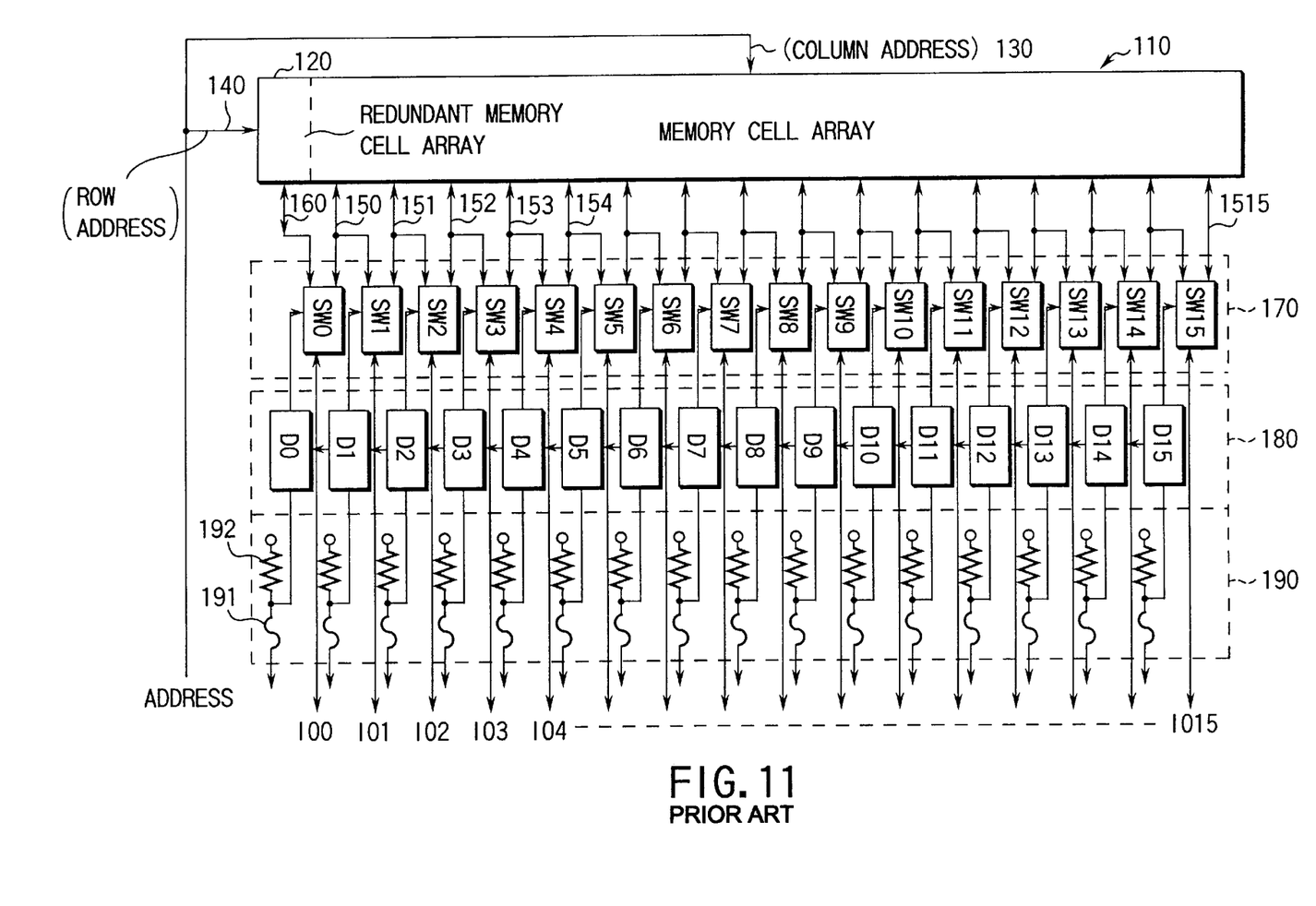
FIG. 11 is a block diagram showing an example of a conventional semiconductor memory device.

FIG. 11 shows an example of a semiconductor memory device using a conventional data line shift method. This semiconductor memory device has a memory cell array 110 and a redundant memory cell array 120. Address signals are supplied to the memory cell array 110 and the redundant memory cell array 120 as a column address signal 130 and a row address signal 140, respectively. Data lines 150, 151, 152, 153, 154, . . . , 1515 having 16-bit data width are connected to the memory cell array 110, and a redundant data line 160 is connected to the redundant memory cell array 120. Data read from the memory cell array 110 depending on the address signals 130 and 140 are supplied to a switch circuit group 170 through the data lines 150, . . . , 1515. The switch circuit group 170 has switches SW0 . . . SW15. The input terminal of the switch SW0 is connected to the redundant data line 160 and the data line 150, and the input terminals of the switches SW1, . . . SW15 are connected to two adjacent data lines. The output terminals of the switches SW0, . . . SW15 are connected to data input/output line IO0, IO1, . . . , IO15, respectively. Decode circuits D0, . . . , D15 constituting a decoder group 180 are connected to the switches SW0, . . . SW15, and connection points between fuses 191 and resistors 192 constituting a fuse circuit group 190 are connected to the decode circuits D0, . . . , D15, respectively.

In the arrangement described above, when the memory cell array 110 has a defective memory cell, a fuse corresponding to the data line to which the defective memory cell is connected is cut. For example, if the data line 154 has a defect, in correspondence with this, the fuse connected to the decode circuit D4 is cut. At this time, depending on an output signal from the decode circuit D4 corresponding to the fuse, the switch SW4 connects the adjacent data line 153 to the data input/output line IO4 to relief the defective data line 154 by the non-defective data line 153. In accordance with this, signals are sequentially transmitted from the decode circuit D4 to the decoder D0, and the switches SW3, . . . , SW0 are switched by the decoders D4, . . . , D0. For this reason, the switch SW3 connects the data line 152 to the data input/output line IO3, and the switch SW2 connects the data line 151 to the data input/output line IO2. In this manner, the respective switches are switched, so that each switch selects an adjacent data line. The last switch SW0 connects the redundant data line 160 to the data input/output line IO0. As described above, the defective data line 154 is relieved.

In relief of a defective memory cell by the data line shift method shown in FIG. 11, since only one data line is relieved depending on an input address, relieving efficiency does not sufficiently increase. More specifically, data lines except for the data line corresponding to a decode circuit connected to the cut fuse cannot be relieved. For this reason, in order to improve the relieving efficient, a method in which different defective data lines can be replaced depending on input addresses.

Figure 12:
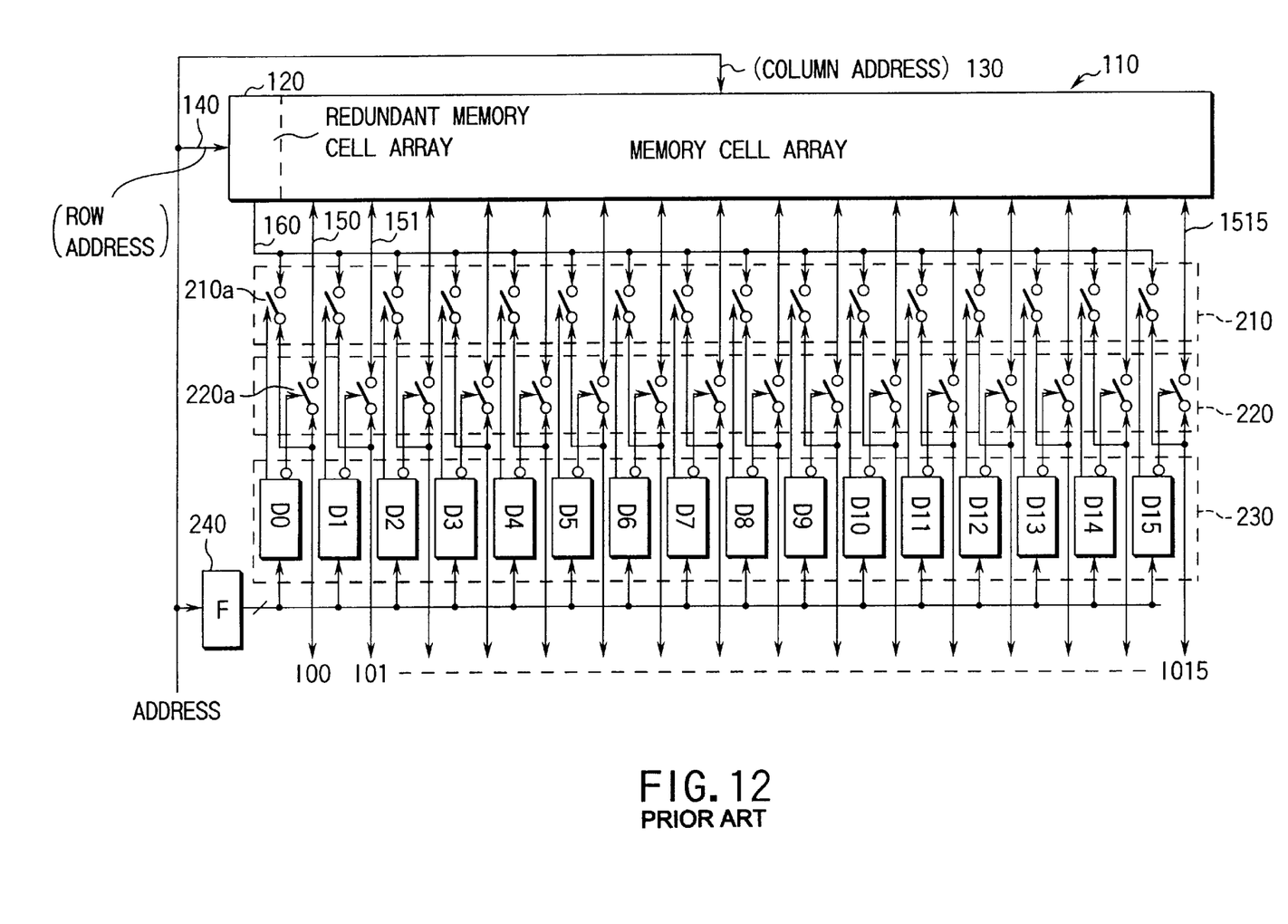
FIG. 12 is a block diagram showing another example of a conventional semiconductor memory device.

FIG. 12 shows another example of a conventional semiconductor memory device, and shows an example in which a redundant data line can be replaced with a plurality of defective data lines. FIG. 12 shows a circuit disclosed in Jpn. Pat. Appln. KOKAI Publication No. 7-114800. The same reference numerals as in FIG. 11 denote the same parts in FIG. 12. In case of this example, one terminals of switches 210a constituting a first switch circuit group 210 are connected to a redundant data line 160. One terminals of switches 220a constituting a second switch group 220 are connected to data lines 150, 151, 152, 153, 154, . . . , 1515, respectively. The other terminals of the switches 210a of the first switch circuit group 210 and the other terminals of the switches 220a of the second switch group 220 are connected to corresponding data input/output line IO0, . . . , IO15. The switches 210a of the first switch circuit group 210 are controlled by output signals from decode circuits D0, . . . , D15 constituting a decoder group 230, and the switches 220a of the second switch group 220 are controlled by inverted output signals from the decode circuits D0, . . . , D15 constituting the decoder group 230. The decode circuits D0, . . . , D15 are connected to a defective address memory circuit (F) 240. The defective address memory circuit 240 holds defective addresses, and outputs a signal of a plurality of bits when an input address coincides with an address held in the defective address memory circuit 240. The decode circuits D0, . . . , D15 generally turn on the switches of the second switch group 220 depending on output signals from the defective address memory circuit 240 and set the switches of the first switch circuit group 210 in an OFF state. On the other hand, when a defective address held in the defective address memory circuit 240 coincides with an input address, an output signal from the corresponding decode circuit is inverted depending on an output signal from the defective address memory circuit 240. For example, when the data line 151 has a defect, and an output signal from the decode circuit D1 is inverted, the data line 151 is disconnected from the data input/output line I01 to be connected to the redundant data line 160. Therefore, the data line 151 is relieved by the redundant data line 160.

In case of this example, a defective data line can be relieved depending on an input address. In addition, when a defective address is supplied, a data line connected to the defective memory cell is instantaneously switched to a redundant data line. For this reason, data transfer has a time margin. However, when a data width becomes large, the length of the redundant data line 160 increases. Therefore, a wiring capacity increases, and it is expected that high-speed data transfer cannot be easily performed.

BRIEF SUMMARY OF THE INVENTION

It is an object of the present invention to provide a semiconductor memory device being capable of performing high-speed data transfer even if a data width becomes large.

The object of the present invention is achieved by the following arrangement.

A semiconductor memory device comprises: a memory cell array in which a plurality of memory cells are arranged; a redundant memory cell array arranged to be adjacent to one end of the memory cell array; a plurality of data lines, connected to the memory cell array, for transferring data; a redundant data line, connected to the redundant memory cell array; for transferring data; a plurality of input/output data lines arranged in correspondence with the plurality of data lines; a first switch group having a plurality of switches, the switches connecting the data lines to the input/output data lines connected to the data lines; a second switch group having switches whose number is equal to the number of switches of the first switch group, the second switch group connecting the data lines except for a data line located at the other end of the memory cell array, the redundant data line, and the input/output data line to each other; a defective address memory circuit for storing an address of a defective data line; and a decoder group having a plurality of decode circuits, the decode circuits being arranged in correspondence with the switches constituting the first and second switch groups, and simultaneously outputting signals for controlling switches located between the defective data line and the redundant data line of the switches constituting the first and second switch groups depending on the address of the defective data line output from the defective address memory circuit, wherein the switches located between the defective data line and the redundant data line are simultaneously changed in accordance with the signals output from the decode circuits.

The present invention provides a semiconductor memory device comprising: a memory cell array in which a plurality of memory cells are arranged; a first redundant memory cell array arranged to be adjacent to the least significant bit of the memory cell array; a second redundant memory cell array arranged to be adjacent to the most significant bit of the memory cell array; a plurality of data lines, connected to the memory cell array, for transferring data; a first redundant data line, connected to the first redundant memory cell array, for transferring data; a second redundant data line, connected to the second redundant memory cell array, for transferring data; a plurality of input/output data lines arranged in correspondence with the plurality of data lines; a switch group having a plurality of switches, the switches having output terminals to which the input/output data lines are connected, of the switches, to the least significant switch having an input terminal to which a data line located at the least significant bit of the memory cell array is connected, a data line adjacent to the data line located at the least significant bit and the first redundant data line being connected, to the most significant switch having an input terminal to which a data line located at the most significant bit of the memory cell array is connected, a data line adjacent to the data line located at the most significant bit and the second redundant data line being connected, and to a plurality of switches having input terminals to which the data lines except for the least significant and most significant data lines are connected, the data line corresponding to the input/output data line and data lines located both the sides of the data line being connected; a defective address memory circuit for storing an address of a defective data line; and a decoder group having a plurality of decode circuits, the decode circuits being arranged in correspondence with the switches constituting the switch group, and simultaneously outputting signals for controlling switches located between the defective data line and the redundant data line of the switches constituting the switch group depending on the address of the defective data line output from the defective address memory circuit, wherein the switches located between the defective data line and the redundant data line are simultaneously changed in accordance with the signals output from the decode circuits.

Furthermore, the present invention provides a semiconductor memory device comprising: a memory cell array in which a plurality of memory cells are arranged; a redundant memory cell array arranged to be adjacent to one end of the memory cell array; a plurality of data lines, connected to the memory cell array, for transferring data; a redundant data line, connected to the redundant memory cell array, for transferring data; a plurality of input/output data lines arranged in correspondence with the plurality of data lines; a first selection circuit group having a plurality of selection circuits, the selection circuits connecting the data lines to the corresponding input/output data lines; a second selection circuit group having selection circuits whose number is equal to the number of selection circuits of the first selection circuit group, the selection circuits of the second selection circuit group connecting the data lines except for a data line located at the other end of the memory cell array, the redundant data line, and the input/output data line to each other; a defective address memory circuit for storing an address of a defective data line; and a decoder group having a plurality of decode circuits, the decode circuits being arranged in correspondence with the selection circuits constituting the first and second selection circuit groups, and simultaneously turning off the selection circuit of the first selection circuit group located between the defective data line and the redundant data line and simultaneously turning on the selection circuit of the second selection circuit group.

According to the present invention, since switches serving as selecting means located between a defective data line and a redundant data line are simultaneously switched, data lines can be shifted at a high speed even if a data width becomes large, and high-speed data transfer can be performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described below with reference to the accompanying drawings.

Figure 1:
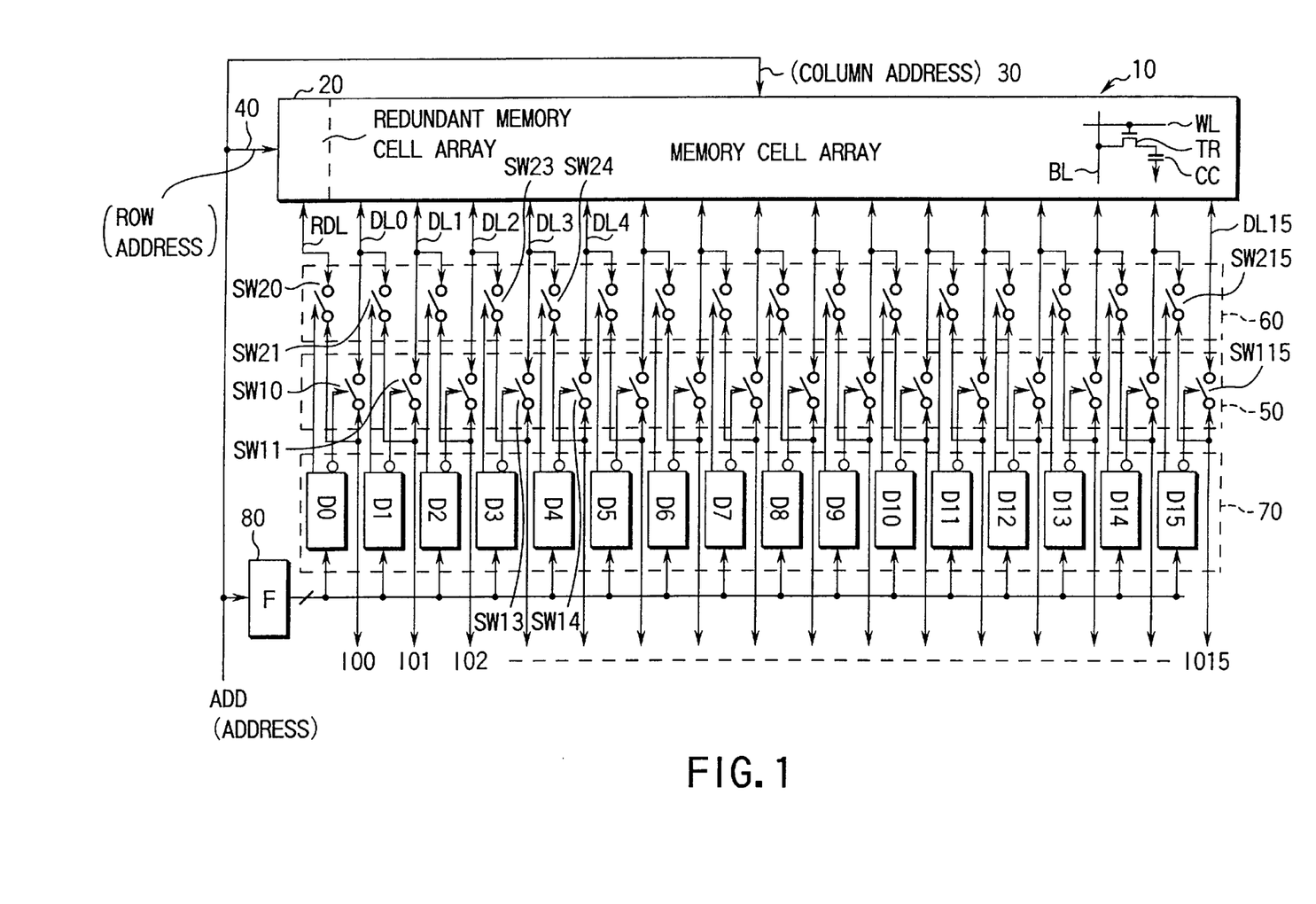
FIG. 1 is a block diagram showing the first embodiment of the present invention.

FIG. 1 shows the first embodiment of the present invention, and shows an example of a semiconductor memory device using a data line shift method. This semiconductor memory device has a memory cell array 10 and a redundant memory cell array 20 constituting, e.g., a DRAM. The memory cell array 10 is constituted such that a plurality of memory cells are arranged in the form of a matrix. Each memory cell is constituted by, e.g., a capacitor CC and a transfer transistor TR. The gate of the transfer transistor TR is connected to a word line WL, one terminal of a current path is connected to the capacitor CC, and the other terminal is connected to a bit line BL. These bit lines are connected to data lines, respectively.

Address signals ADD are supplied to the memory cell array 10 and the redundant memory cell array 20 as a column address signal 30 and a row address signal 40. Data lines DL0, DL1, DL2, DL3, DL4, . . . , DL15 having a data width of 16 bits are connected to the memory cell array 10, and a redundant data line RDL is connected to the redundant memory cell array 20. The data lines DL0, . . . , DL15 are connected to data input/output line IO0, . . . , IO15 through a first switch circuit group 50. More specifically, the data lines DL0, . . . , DL15 are connected to one terminals of switches SW10, SW11, . . . , SW115 constituting the first switch circuit group 50, respectively, and the other terminals of the switches SW10, SW11, . . . , SW115 are connected to data input/output line IO0, IO2, . . . , IO15, respectively.

The redundant data line RDL and the data lines DL0, . . . , DL14 are connected to the data input/output line IO0, IO1, . . . , IO15 through a second switch circuit group 60 for switching data lines, respectively. More specifically, the redundant data line RDL and the data lines DL0, . . . , DL14 are connected to one terminals of switches SW20, SW21, . . . , SW215 constituting the second switch circuit group 60, and the other terminals of the switches SW20, SW21, . . . , SW215 are connected to the data input/output line IO0, . . . , IO15, respectively.

The switches constituting the first and second switch circuit groups 50 and 60 are controlled by the decode circuits D0, . . . , D15 constituting a decoder group 70, respectively. More specifically, the non-inverted output terminal of the decode circuit D0 is connected to the switch SW20, and the inverted output terminal is connected to the switch SW10. The non-inverted output terminal of the decode circuit D1 is connected to the switch SW21, and the inverted output terminal is connected to the switch SW11. In the same manner as described above, the non-inverted output terminal of the decode circuit D15 is connected to the switch SW215, and the inverted output terminal is connected to the switch SW115. The output terminal of a defective address memory circuit 80 is connected to the input terminals of the decode circuits D0, . . . , D15. The defective address memory circuit 80 stores the address of a defective data line, and stores data representing whether the data line is replaced. The defective address memory circuit 80 outputs, depending on an input column or row address, the address of a defective data line constituted by a signal of a plurality of bits and a signal representing whether a data line is replaced.

The decode circuits D0, . . . , D15 generally turn on the respective switches of the first switch circuit group 50 depending on an output signal from the defective address memory circuit 80, and turn off the switches of the second switch circuit group 60. On the other hand, when data lines are to be replaced, depending on an output an output signal from the defective address memory circuit 80, output signals from decode circuits corresponding to a defective data line and a redundant data line and an output signal from a decode circuit located between these decode circuits are inverted. For example, the data line DL4 has a defect, output signals from the decode circuits D0, . . . , D4 are simultaneously inverted depending on the output signal from the defective address memory circuit 80. The switches SW10, . . . , SW14 of the first switch circuit group 50 are turned off, and the switches SW20, . . . , SW24 of the second switch circuit group 60 are turned on. For this reason, the data line DL4 is replaced with the data line DL3, and the data line DL3 is replaced with the data line DL2. In the same manner as described above, the data line DL0 is replaced with the redundant data line RDL. The replacing operations by the switches are simultaneously performed depending on the output signals from the decode circuits D0, . . . , D4.

Figure 2:
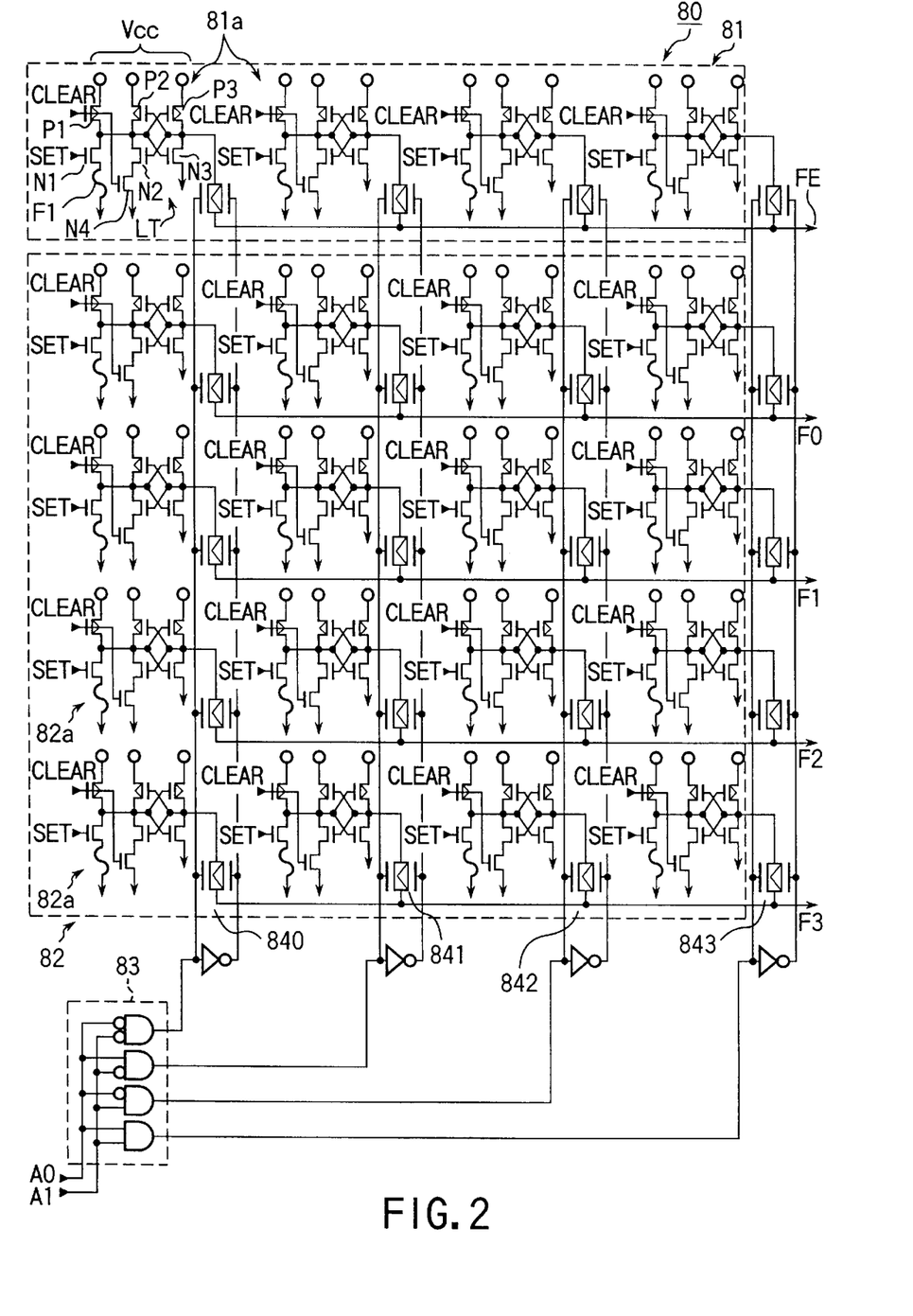
FIG. 2 is a circuit diagram showing the arrangement of a part of FIG. 1.

FIG. 2 shows the defective address memory circuit 80. The defective address memory circuit 80 is constituted by first and second fuse circuit groups 81 and 82, a decoder 83, and a plurality of transfer gate groups 840, . . . , 843. The first fuse circuit group 81 has a plurality of fuse circuits 81a for storing data representing whether data lines are replaced with each other. The second fuse circuit group 82 has a plurality of fuse circuits 82a for storing the addresses of defective data lines. The decoder 83 outputs a selection signal for selecting a predetermined fuse circuit from the first and second fuse circuit groups 81 and 82 depending on a column or row address signal A0 or A1. The transfer gate groups 840, . . . , 843 extract output signals from the fuse circuits 81a and 82a depending on the selection signal supplied from the decoder 83. The defective address memory circuit 80 can store, e.g., four defective addresses, and the stored defective addresses are selectively extracted by the transfer gate groups 840, ..., 843.

Since the fuse circuits 81a and 82a have the same arrangement, only the fuse circuits 81a will be described below. A p-channel MOS transistor P1, an n-channel MOS transistor N1, and a fuse F1 are serially connected between a terminal to which a power supply voltage Vcc is supplied and the ground. A clear signal CLEAR is supplied to the gate of the p-channel MOS transistor P1, and a set signal SET is supplied to the gate of the n-channel MOS transistor N1. The input terminal of a latch circuit LT is connected to the connection point between the transistors P1 and N1. The latch circuit LT is constituted by p-channel MOS transistors P2 and P3 and n-channel MOS transistors N2 and N3, and the connection point between the transistors P2 and N2 serves as the input terminal. One terminal of the n-channel MOS transistor N2 is grounded through an n-channel MOS transistor N4. The clear signal CLEAR is supplied to the gate of the n-channel MOS transistor N4. The connection point between the transistors P3 and N3 serving as an output terminal is connected to the input terminal of one transfer gate constituting the transfer gate group 840.

The operation of the defective address memory circuit 80 having the above arrangement will be described below. First, the memory cell array 10 is tested to detect a defective data line. If a defective data line is detected as the result of the test, the address of the defective data line is set in the defective address memory circuit 80. More specifically, the fuse of the fuse circuits 81a constituting the first fuse circuit group 81 is cut. Accordingly, of the second fuse circuit group 82, one row of fuse circuits 82a corresponding to the fuse circuits 81a are programmed depending on the address of the defective data line, and fuses F1 of required fuse circuits 82a are cut. Pieces of information of the programmed fuses are latched by the latch circuits LT such that the clear signal CLEAR and the set signal SET are supplied in an power-on state of the semiconductor memory device.

In access to the memory cell array 10, when the address signal A0 or A1 corresponding to a column or a row is supplied to the decoder 83, one of the transfer gate groups 840, ..., 843 is turned on depending on an output from the decoder 83. At this time, from the transfer gate group which is turned on, output signals FE, F0, F1, F2, and F3 obtained by combining signals each having a logical level of "1" or "0" are output. The output signal FE represents whether data lines are replaced with each other, and the signals F0, F1, F2, and F3 represent the address of a defective data line. These signals are supplied to the decode circuits D0, ..., D15 constituting the decoder group 70. These decode circuits D0, ..., D15 decode supplied signals and control the switching operations of the respective switches of the first and second switch circuit groups 50 and 60.

Figure 3:
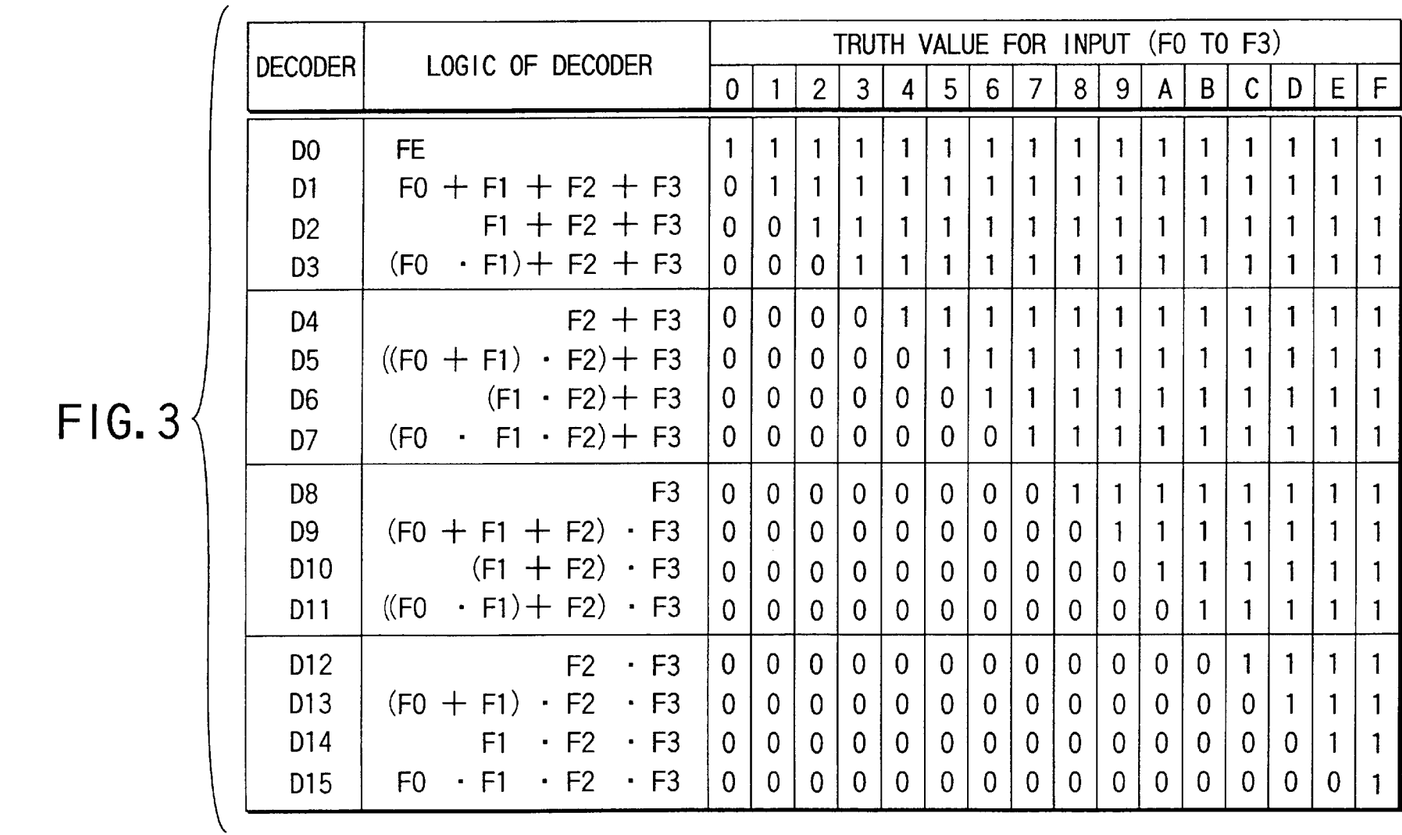
FIG. 3 is a table for explaining the logic of the circuit diagram shown in FIG. 2.

FIG. 3 shows the logic of output signals from the defective address memory circuit 80 and the decode circuits D0, ..., D15. When a defective data line is replaced, the output signal FE is set at "1"; when the defective data line is not replaced, the output signal FE is set at "0". The signals F0, F1, F2, and F3, as described above, represent the least significant bit to the most significant bit. The decode circuits D0, ..., D15 decode the signals F0, F1, F2, and F3 according to the logic shown in FIG. 3. When the address of the defective data line is equal to or larger than the address of a corresponding data line, logic "1" is output from the non-inverted output terminal; when the address of the defective data line is smaller than the address of the corresponding data line, logic "0" is output from the non-inverted output terminal.

When the data line DL3 is defective, the data lines D0, ..., DL3 output logic "1" from non-inverted output terminals, and the decode circuits D4, ..., D15 output logic "0" from non-inverted output terminals. For this reason, the switches SW10, ..., SW13 of the first switch circuit group 50 are turned off, and the switches SW14, ..., SW115 are turned on. The switches SW20, ..., SW23 of the second switch circuit group 60 are turned on, and the switches SW24, ..., SW215 are turned off. For this reason, the data line DL3 is replaced with the data line DL2, the data line DL2 is replaced with the data line DL1, the data line DL1 is replaced with the data line DL0, and the data line DL0 is replaced with the redundant data line RDL.

When the data line is not replaced, the output signal FE from the defective address memory circuit 80 is set at "0", and the other signals F0, ..., F3 are set at "0". For this reason, the non-inverted output terminals of the decode circuits D0, ..., D15 output signals each having logic "0". Therefore, the data line is not replaced.

When the data line which is furthest away from the redundant data line RDL is replaced, the output signal FE from the defective address memory circuit 80 has logic "1", and each of the signals F0, ..., F3 has logic "1". For this reason, all the non-inverted output terminals of the decode circuits D0, ..., D15 output signals each having logic "1". For this reason, all the data lines are replaced.

Figure 4:
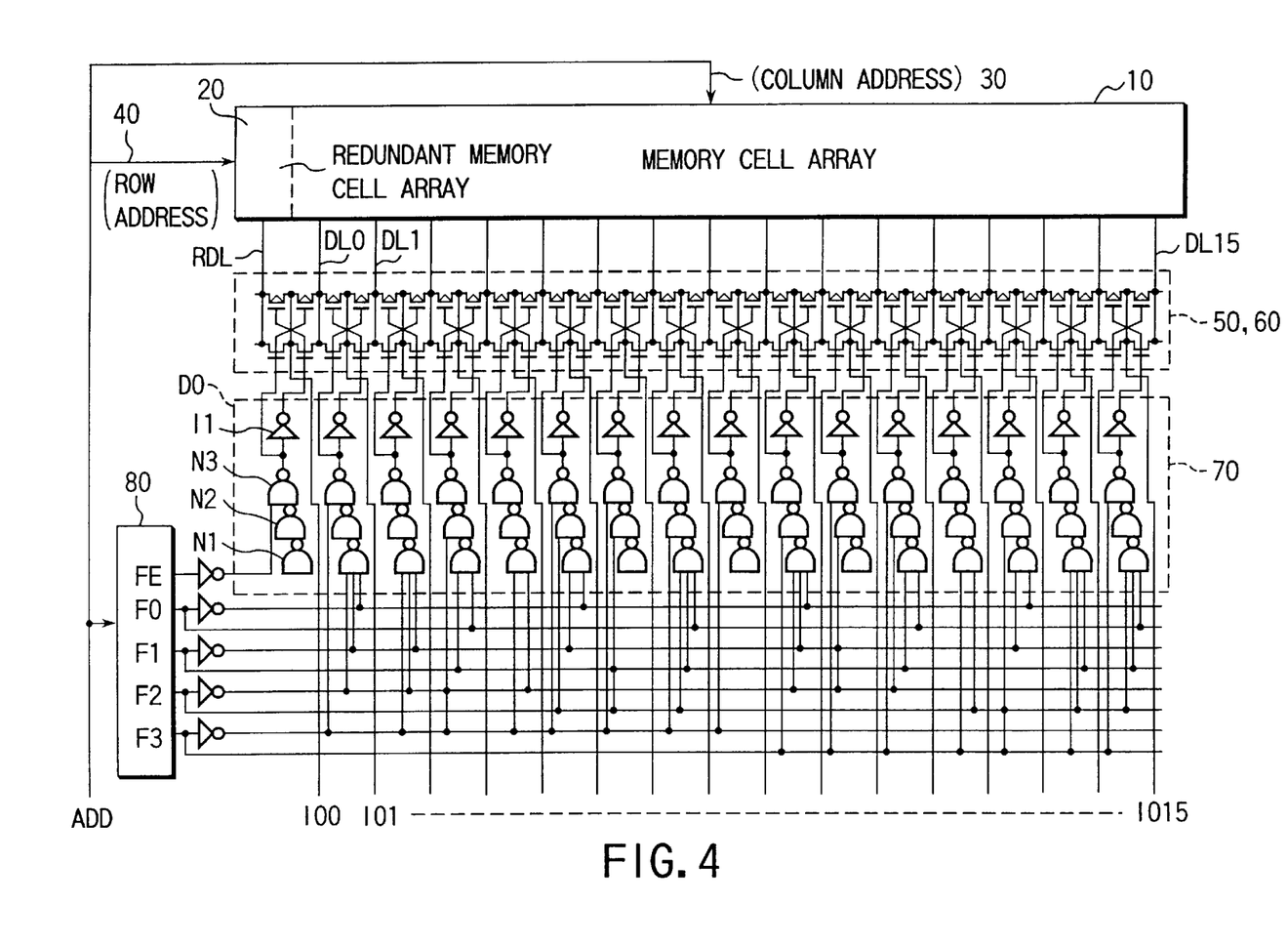
FIG. 4 is a circuit diagram concretely showing the block diagram shown in FIG. 1.

FIG. 4 is a circuit diagram concretely showing the arrangement shown in FIG. 1. The same reference numerals as in FIG. 1 denote the same parts in FIG. 4. In this circuit, all the decode circuits D0, ..., D15 constituting the decoder group 70 are constituted by, e.g., NAND circuits N1, N2, and N3 of three stages and an inverter circuit I1. A signal FE output from the defective address memory circuit 80 and representing whether replacing is performed is supplied to only the input terminal of only the decode circuit D0 of the decode circuits D0, ..., D15. Signals F0, ..., F3 representing the address of the defective data line are supplied to the decode circuit D1, ..., D15, respectively. When the signal FE representing whether replacing is performed is input to only the decode circuit D0, a wiring length for the signal can be decreased. For this reason, the switches can be controlled at a high speed.

A NAND circuit whose input terminal is not connected represents that a signal having logic "1" is supplied to the input terminal. With the arrangement and the logic, the decode circuits D0, ..., D15 have the same circuit arrangement, and the circuit can be simplified.

In the arrangement described above, the NAND circuits N1, N2, and N3 can also be replaced with AND circuits, respectively.

In addition, each of the switches constituting the second switch circuit groups 50 and 60 is constituted by a transfer gate constituted by an n-channel MOS transistor and a p-channel MOS transistor. The arrangement of each switch is not limited to the transfer gate. The switch can also be constituted by a logic gate.

Figure 5:
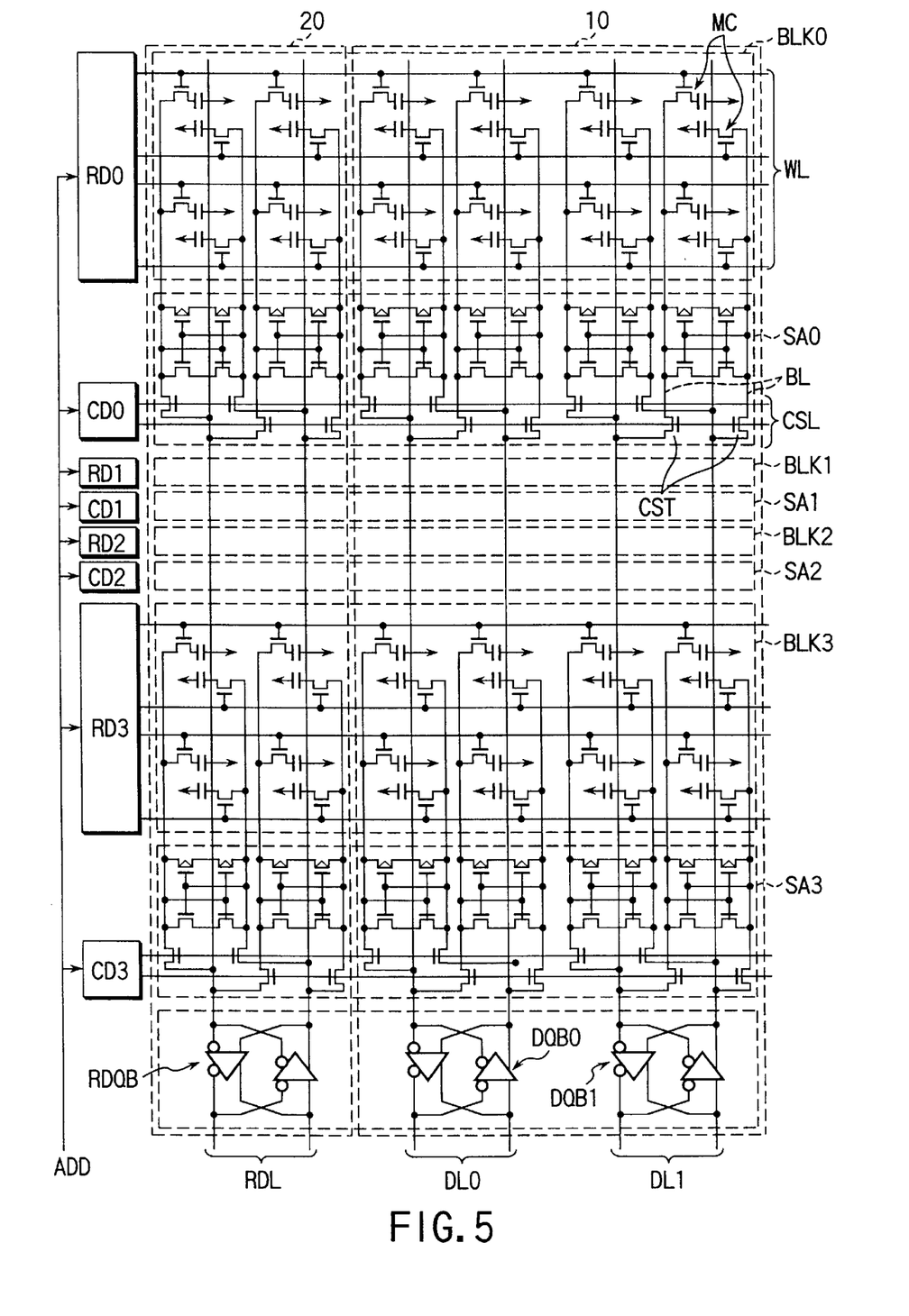
FIG. 5 is a circuit diagram showing the arrangement of a part of FIG. 1.

FIG. 5 shows a circuit of a part of the redundant memory cell array 20 and the memory cell array 10. The same reference numerals as in FIG. 1 denote the same parts in FIG. 5. The arrangement of the memory cell array 10 and the redundant memory cell array 20 are not limited to the arrangement shown in FIG. 5.

The memory cell array 10 and the redundant memory cell array 20 are divided into, e.g., four memory array blocks BLK0, ..., BLK3. In each of the memory array blocks BLK0, ..., BLK3, a plurality of memory cells MC each constituted by one transistor and one capacitor are arranged in the form of a matrix. The gate of each transistor is connected to a word line WL, and one terminal of the current path of each transistor is connected to a bit line BL. Row decoders RD0, . . . , RD3 for selecting the word line depending on a row address are arranged in the row direction of the memory array blocks BLK0, . . . , BLK3.

In the column direction of the memory array blocks BLK0, . . . , BLK3, sense amplifier blocks SA0, . . . , SA3 are arranged. Each of the sense amplifier blocks SA0, . . . , SA3 has a plurality of sense amplifiers. Each sense amplifier is connected to the pair of bit lines BL, and the bit lines BL are connected to one terminals of the current paths of column selection transistors CST. Column selection lines CSL are connected to the gates of the column selection transistors CST. Column decoders CD0, . . . , CD3 are arranged to be adjacent to the sense amplifier blocks SA0, . . . , SA3, and the column decoders CD0, . . . , CD3 select the column selection lines CSL in accordance with a column address.

The other terminals of the current paths of the column selection transistors CST arranged in the redundant memory cell array 20 are connected to the redundant data line RDL. The other terminals of the current paths of the column selection transistors CST arranged in the memory cell array 10 are connected to the data lines DL0, DL1, . . . , respectively. Buffers RDQB, DQB0, DQB1, . . . are connected to the redundant data line RDL and the data lines DL0, DL1, . . . , respectively.

According to the first embodiment, the decoders arranged in the decoder group 70 decode the address of a defective data line output from the defective address memory circuit 80 and simultaneously output signals for switching the ON/OFF states of the switches constituting the first and second switch groups 50 and 60. Therefore, switches of the defective data line to the redundant data line can be simultaneously switched depending on the address of the defective data line. For this reason, unlike the prior art, a high-speed operation can be performed without depending on an output signal from an adjacent decoder.

Since the redundant data line need not be wired along the memory cell array, the capacity of the redundant data line can be suppressed to the minimum. In addition, since the capacity of the redundant data line does not depend on the number of data lines, a high-speed operation can be performed.

Furthermore, in the defective address memory circuit 80 shown in FIG. 2, fuses are arranged in the fuse circuits 81a, . . . , and the fuse circuits are connected to signal lines for transmitting the output signals FE, F0, F1, F2, and F3 through the transfer gate groups 840, . . . , 843, respectively. Therefore, since the fuses are not directly connected to the signal lines for transmitting the output signals FE, F0, F1, F2, and F3, transmission delay of the signals FE, F0, F1, F2, and F3 can be prevented, and a high-speed operation can be performed.

In addition, according to the first embodiment, fuses are arranged in the defective address memory circuit apart from the decode circuits, and are programmed in accordance with the address of the defective data line. Therefor, a plurality of defective data lines can be relieved.

Figure 6:
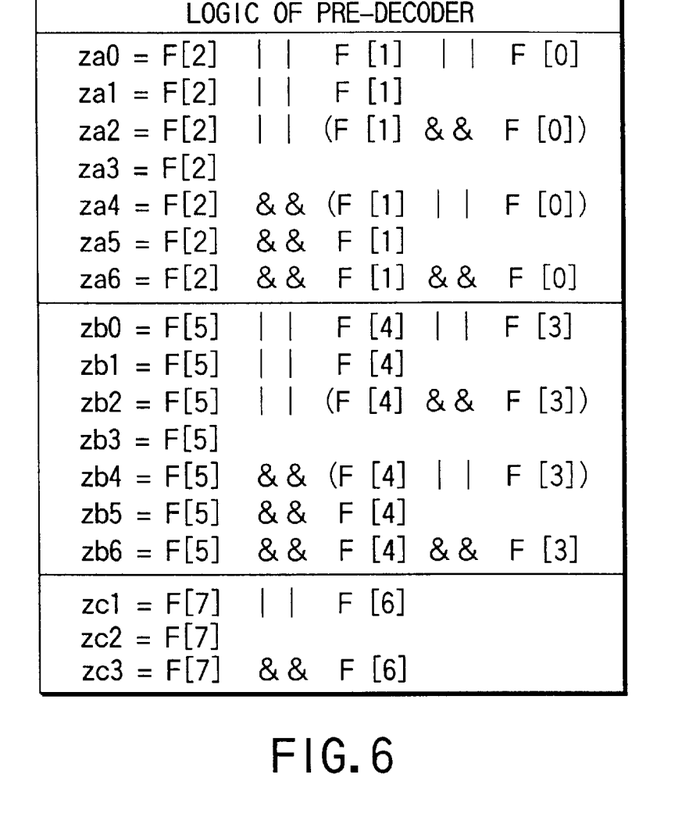
FIG. 6 is a table for explaining a modification of the first embodiment.
Figure 7:
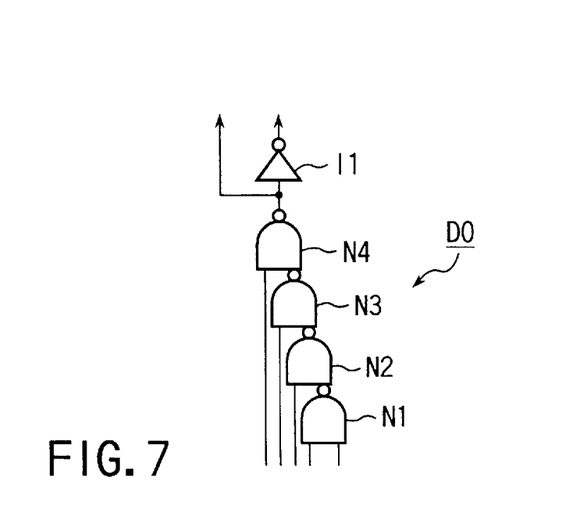
FIG. 7 is a circuit diagram showing an example of a decode circuit applied to the modification of the first embodiment.

FIGS. 6 and 7 show a modification of the first embodiment. Although the first embodiment sixteen data lines, this modification explains the logic of decoders for 144 data lines. In order to designate one of the 144 data lines, the modification is arranged such that address lines of eight bits are used. More specifically, signals of eight bits (to be referred to as F[0:8]) are output from a defective address memory circuit. The three low-order bits F[0:2] of the eight bits are pre-decoded according to the logic shown in FIG. 2 and FIG. 3 to generate seven pre-decode signal (to be referred to as za[0:6]). In the same manner as described above, the next three bits F[3:5] are pre-decoded to generate seven pre-decode signals (to be referred to zb[0:6]. In addition, the remaining two high-order bits F[6:7] are pre-decoded to generate three pre-decode signals (to be referred to as zc[0:2]). FIG. 6 shows the logic of the pre-decode signals. In FIG. 6, "&&" denotes a logical AND, and "| |" denotes a logical OR.

In this modification, the decoder group has 144 decode circuits, and the pre-decode signals za[0:6], zb[0:6], and zc[0:2] are selectively supplied to these decode circuits. Each decode circuit, as shown in FIG. 7, is constituted by NAND circuits N1, . . . , N4 of four stages and an inverter circuit I1 of one stage. Each of the first and second switch groups is constituted by 144 switches. These switches are controlled by output signals from the 144 decode circuits.

With this arrangement, 144 data lines can be replaced with each other at a high speed.

Figure 8:
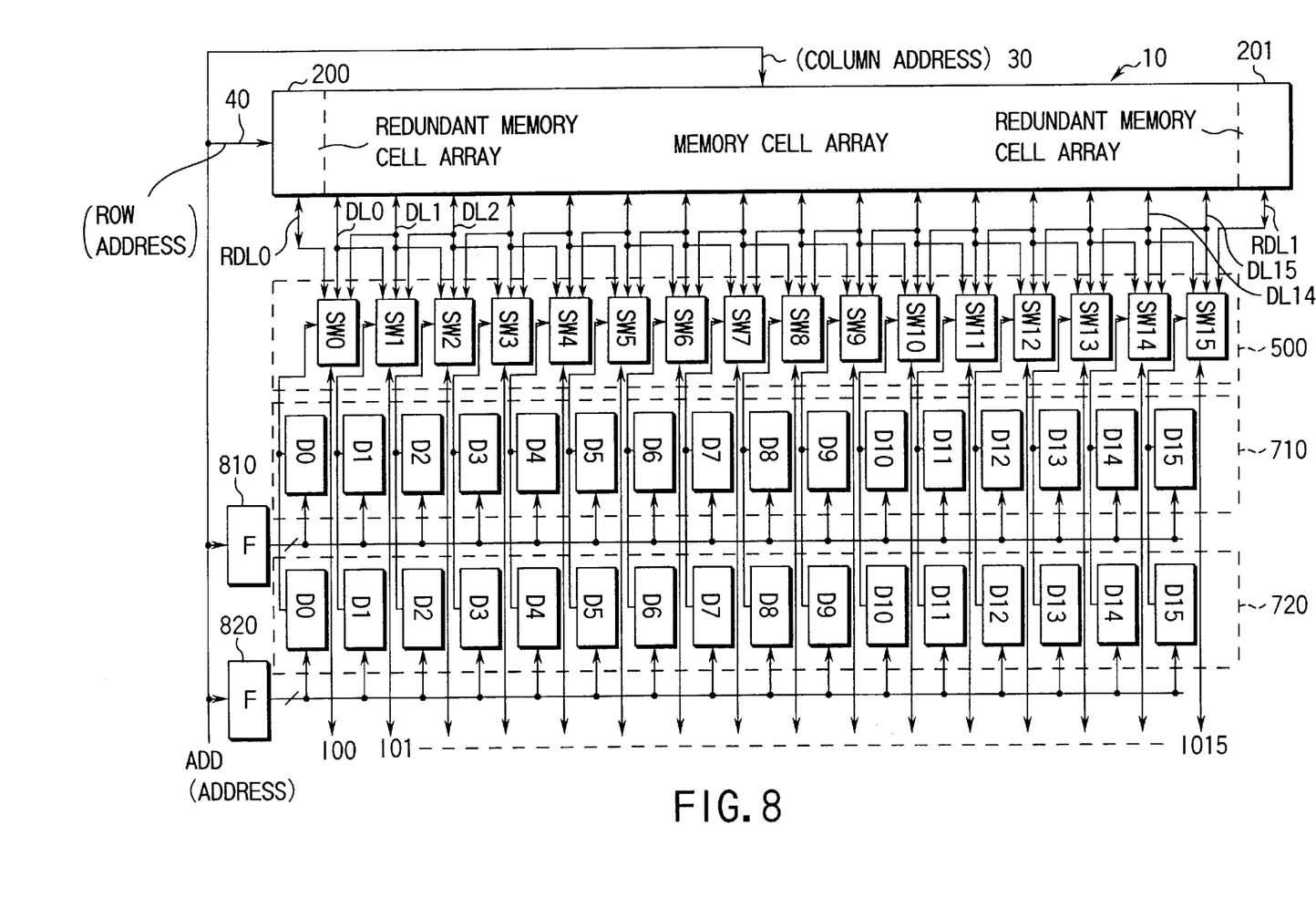
FIG. 8 is a block diagram showing a second embodiment of the present invention.

FIG. 8 shows the second embodiment of the present invention. The same reference numerals as in FIG. 1 denote the same parts in FIG. 8. In this embodiment, two series of redundant data lines are arranged. More specifically, redundant memory cell arrays 200 and 201 are arranged on both the sides of the most significant bit and the least significant bit of a memory cell array 10, and redundant data lines RDL0 and RDL1 are arranged for the redundant memory cell arrays 200 and 201. In addition, a switch group 500 for shifting data lines on the least significant side (left side in FIG. 8) or the most significant side (right side in FIG. 8). The switch group 500 is controlled by first and second decoder groups 710 and 720. A defective address is stored in the first decoder group 710, and a first defective address memory circuit 810 for outputting a signal depending on the stored address is connected to the first decoder group 710. A defective address is stored in the second decoder group 720, and a second defective address memory circuit 820 for outputting a signal depending to the stored address is connected to the second decoder group 720.

Switches SW0, . . . SW15 constituting the switch group 500 are 3-input switches, and corresponding data lines and data lines on both the sides of the corresponding data lines are connected to the input terminals of the switches SW0, . . . SW14. A corresponding data line DL0, a data line DL1 adjacent to the data line DL0, and the redundant data line RDL0 are connected to the input terminal of the switch SW0. A corresponding data line DL15, a data line DL14 adjacent to the data line DL15, and the redundant data line RDL1 are connected to the input terminal of the switch SW15.

The first defective address memory circuit 810 controls corresponding switches of the switch group 500 depending on a defective address to replace a data line located on the high-order side of the defective data line with a data line on the high-order side. The second defective address memory circuit 820 controls corresponding switches of the switch group 500 to replace a data line located on the low-order side of the defective data line with a data line on the low-order side. The arrangements and logic of the first and second decoder groups 710 and 720 and the first and second defective address memory circuits 810 and 820 are the same as described in the first embodiment and the modification thereof.

Figure 9:
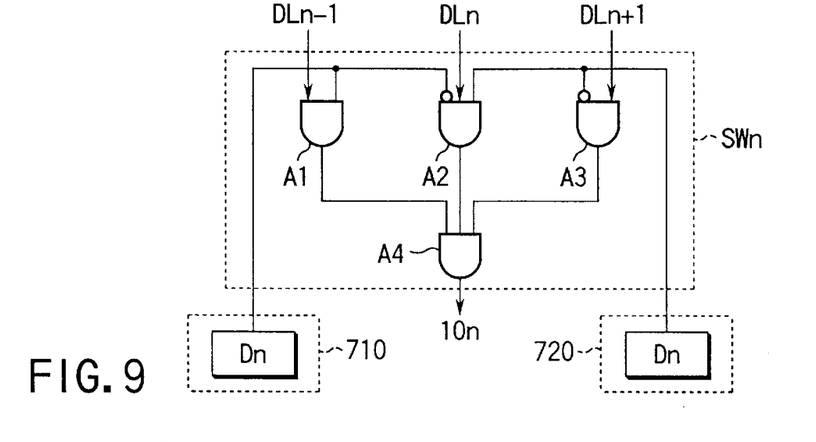
FIG. 9 is a circuit diagram showing an example of a switch shown in FIG. 8.

FIG. 9 shows an example of a switch SWn (n=0, ..., 15). The switch SWn is constituted by, e.g., four AND circuits A1, A2, A3, and A4. Data lines DLn−1, DLn, and DLn+1 are connected to the first input terminals of the AND circuits A1, A2, and A3. An output signal from a decode circuit Dn of the first decoder group 710 is supplied to the second input terminals of the AND circuits A1 and A2. An output signal from the decode circuit Dn of the second decoder group 720 is supplied to the third input terminal of the AND circuit A2 and the second input terminal of the AND circuit A3. The output terminals of the AND circuits A1, A2, and A3 are connected to the input terminal of the AND circuit A4, and the output terminal of the AND circuit A4 is connected to an input/output data line IOn.

Figure 10A:
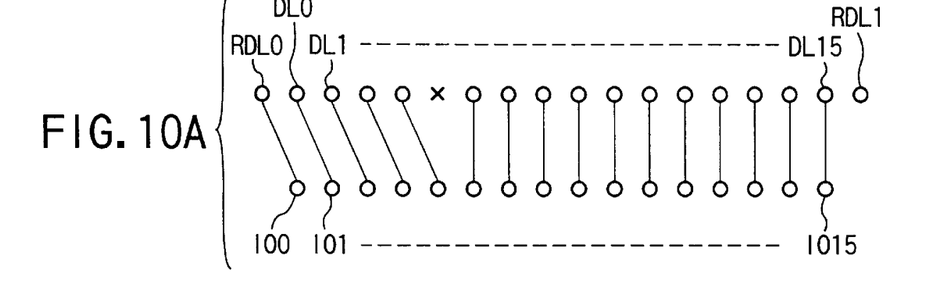
FIGS. 10A, 10B, and 10C are schematic views for explaining an operation in FIG. 8.
Figure 10B:
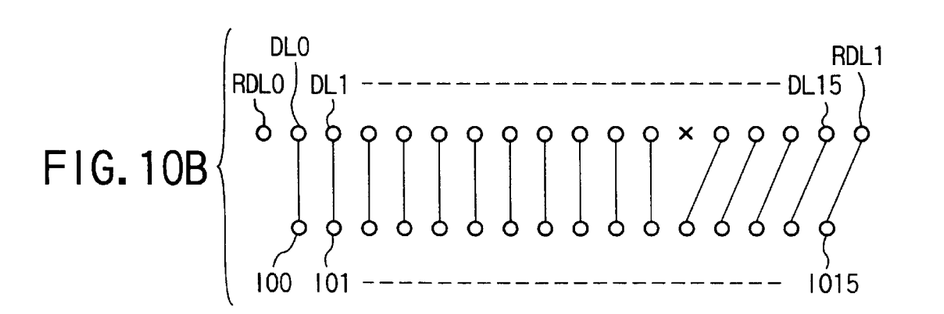

In the arrangement, in a method of replacing data lines, the following manner may be used. When one defective data line exists, the redundant data line RDL0 or RDL1 is used depending on the position of the defective data line. More specifically, for example, when a data line near the redundant data line RDL0 is defective, as shown in FIG. 10A, the defective data line (indicated by mark X) is replaced with a data between the defective data line and the redundant data line RDL0. When a data line near the redundant data line RDL1 is defective, as shown in FIG. 10B, a defective data line (indicated by mark X) is replaced with a data line between the defective data line and the redundant data line RDL1.

Figure 10C:
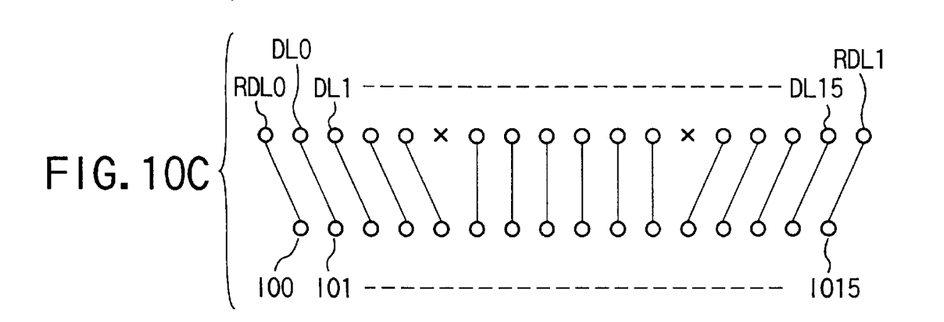

In addition, when two defective data lines exist, as shown in FIG. 10C, one defective data line (indicated by mark x) is replaced with a data line between the defective data line and the redundant data line RDL0. Accordingly, the other defective data line (indicated by mark x) is replaced with a data line between the defective data line and the redundant data line RDL1. The replacing of these data lines can also be executed such that the fuses of the first and second defective address memory circuits 810 and 820 are programmed depending on the number of defective data lines and the positions of the defective data lines.

According to the second embodiment, the same effect as in the first embodiment can be obtained. Furthermore, according to the second embodiment, since a plurality of data lines can be relieved, relieving efficiency can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor memory device comprising:
   a memory cell array in which a plurality of memory cells are arranged;
   a redundant memory cell array arranged to be adjacent to one end of the memory cell array;
   a plurality of data lines, connected to the memory cell array, for transferring data;
   a redundant data line, connected to the redundant memory cell array, for transferring data;
   a plurality of input/output data lines arranged in correspondence with the plurality of data lines;
   a first switch group having a plurality of switches, the switches connecting the data lines to the input/output data lines in correspondence with the data lines;
   a second switch group having switches whose number is equal to the number of switches of the first switch group, the second switch group connecting the data lines except for a data line located at the other end of the memory cell array, the redundant data line, and the input/output data line to each other;
   a defective address memory circuit for storing an address of a defective data line; and
   a decoder group having a plurality of decode circuits, the decode circuits being arranged in correspondence with the switches constituting the first and second switch groups, and simultaneously outputting signals for controlling switches located between the defective data line and the redundant data line of the switches constituting the first and second switch groups depending on the address of the defective data line output from the defective address memory circuit, wherein said switches located between the defective data line and the redundant data line are simultaneously changed in accordance with the signals output from the decode circuits.

2. A device according to claim 1, wherein. the defective address memory circuit comprises:
   a plurality of first fuse circuits for storing an address of a defective data line; and
   a transfer gate for transferring the address of the defective data line output from the first fuse circuits depending on an input address.

3. A device according to claim 2, wherein each of the first fuse circuits comprises:
   a fuse programmed depending on the address of the defective data line; and
   a latch circuit for latching a state of the fuse in a power-on state.

4. A device according to claim 1, wherein each of the decode circuits comprises:
   an input terminal for receiving the address of the defective data line output from the defective address memory circuit; and
   a non-inverted output terminal connected to the switches of the second switch circuit group, and an inverted output terminal connected to the switches of the first switch circuit group, and
   each of the decode circuits output a first logic signal from the non-inverted output terminal when the address of the defective data line is equal to or larger than the address of a corresponding data line and output a second logic signal from the non-inverted output terminal when the address of the defective data line is smaller then the address of the corresponding data line.

5. A device according to claim 4, wherein the defective address memory circuit has a second fuse circuit, and the second fuse circuit stores a signal representing replacing of data lines.

6. A device according to claim 5, further comprising
   a wiring for connecting the second fuse circuit to a decode circuit, for controlling a switch to which the redundant data line is connected, in the decoder group, and the replacing signal stored in the second fuse circuit is supplied to only the decode circuit for controlling the switch to which the redundant data line is connected through the wiring.

7. A semiconductor memory device comprising:
   a memory cell array in which a plurality of memory cells are arranged;

a first redundant memory cell array arranged to be adjacent to the least significant bit of the memory cell array;

a second redundant memory cell array arranged to be adjacent to the most significant bit of the memory cell array;

a plurality of data lines, connected to the memory cell array, for transferring data;

a first redundant data line, connected to the first redundant memory cell array, for transferring data;

a second redundant data line, connected to the second redundant memory cell array, for transferring data;

a plurality of input/output data lines arranged in correspondence with the plurality of data lines;

a switch group having a plurality of switches, the switches having output terminals to which the input/output data lines are connected, of the switches, to the least significant switch having an input terminal to which a data line located at the least significant bit of the memory cell array is connected, a data line adjacent to the data line located at the least significant bit and the first redundant data line being connected, to the most significant switch having an input terminal to which a data line located at the most significant bit of the memory cell array is connected, a data line adjacent to the data line located at the most significant bit and the second redundant data line being connected, and to a plurality of switches having input terminals to which the data lines except for the least significant and most significant data lines are connected, the data line corresponding to the input/output data line and data lines located both the sides of the data line being connected;

a defective address memory circuit for storing an address of a defective data line; and a decoder group having a plurality of decode circuits, the decode circuits being arranged in correspondence with the switches constituting the switch group, and simultaneously outputting signals for controlling switches located between the defective data line and the redundant data line of the switches constituting the switch group depending on the address of the defective data line output from the defective address memory circuit, wherein said switches located between the defective data line and the redundant data line are simultaneously changed in accordance with the signals output from the decode circuits.

8. A device according to claim 7, wherein the defective address memory circuit has a first defective address memory circuit for storing an address of a first defective data line, and a second defective address memory circuit for storing an address of a second defective data line.

9. A device according to claim 7, wherein the decoder group comprises:

a first decoder group for controlling the switches depending on the address of the first defective data line supplied from the first defective address memory circuit to replace the data line in a direction of the second redundant data line; and a second decoder group for controlling the switches depending on the address of the second defective data line supplied from the second defective address memory circuit to replace the data line in a direction of the first redundant data line.

10. A device according to claim 7, wherein each of the switches is constituted by a plurality of logic circuits.

11. A semiconductor memory device comprising:

a memory cell array in which a plurality of memory cells are arranged;

a redundant memory cell array arranged to be adjacent to one end of the memory cell array;

a plurality of data lines, connected to the memory cell array, for transferring data;

a redundant data line, connected to the redundant memory cell array, for transferring data;

a plurality of input/output data lines arranged in correspondence with the plurality of data lines;

a first selection circuit group having a plurality of selection circuits, the selection circuits connecting the data lines to the corresponding input/output data lines;

a second selection circuit group having selection circuits whose number is equal to the number of selection circuits of the first selection circuit group, the selection circuits of the second selection circuit group connecting the data lines except for a data line located at the other end of the memory cell array, the redundant data line, and the input/output data line to each other;

a defective address memory circuit for storing an address of a defective data line; and a decoder group having a plurality of decode circuits, the decode circuits being arranged in correspondence with the selection circuits constituting the first and second selection circuit groups, and simultaneously turning off the selection circuit of the first selection circuit group located between the defective data line and the redundant data line and simultaneously turning on the selection circuit of the second selection circuit group.

12. A device according to claim 11, wherein the defective address memory circuit comprises:

a plurality of first fuse circuits for storing an address of a defective data line; and a transfer gate for transferring the address of the defective data line output from the first fuse circuits depending on an input address.

13. A device according to claim 12, wherein each of the first fuse circuits comprises:

a fuse programmed depending on the address of the defective data line; and a latch circuit for latching a state of the fuse in a power-on state.

14. A device according to claim 11, wherein each of the decode circuits comprises:

an input terminal for receiving the address of the defective data line output from the defective address memory circuit; and a non-inverted output terminal connected to the selection circuits of the second selection circuit group, and an inverted output terminal connected to the selection circuits of the first selection circuit group, and each of the decode circuits output a first logic signal from the non-inverted output terminal when the address of the defective data line is equal to or larger than the address of a corresponding data line and output a second logic signal from the non-inverted output terminal when the address of the defective data line is smaller then the address of the corresponding data line.

15. A device according to claim 14, wherein the defective address memory circuit has a second fuse circuit, and the second fuse circuit stores a signal representing replacing of data lines.

16. A device according to claim 15, further comprising
a wiring for connecting the second fuse circuit to a decode circuit, for controlling a selection circuit to which the redundant data line is connected, in the decoder group, and the replacing signal stored in the second fuse circuit is supplied to only the decode circuit for controlling the selection circuit to which the redundant data line is connected through the wiring.

17. A device according to claim 11, wherein
each of the selection circuits is a transfer gate constituted by an n-channel MOS transistor and a p-channel MOS transistor.

18. A device according to claim 11, wherein
each of the selection circuits is constituted by a plurality of logic circuits.

* * * * *